United States Patent
Brintzinger et al.

(10) Patent No.: US 7,271,095 B2
(45) Date of Patent: Sep. 18, 2007

(54) PROCESS FOR PRODUCING METALLIC INTERCONNECTS AND CONTACT SURFACES ON ELECTRONIC COMPONENTS

(75) Inventors: Axel Brintzinger, Dresden (DE); Octavio Trovarelli, Dresden (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/049,615

(22) Filed: Feb. 2, 2005

(65) Prior Publication Data

US 2005/0186772 A1 Aug. 25, 2005

(30) Foreign Application Priority Data

Feb. 3, 2004 (DE) .................. 10 2004 005 361

(51) Int. Cl.
*H01L 21/44* (2006.01)

(52) U.S. Cl. .......... 438/672; 438/598; 438/637; 438/641; 438/668; 438/675; 438/687

(58) Field of Classification Search .......... 438/612, 438/613, 614, 618, 653, 671, 687, 598, 637, 438/641, 668, 675; 257/E21.508, E21.509, 257/E21.511, E21.512
See application file for complete search history.

(56) References Cited

U.S. PATENT DOCUMENTS

| | | | |
|---|---|---|---|
| 4,861,425 A | 8/1989 | Greer et al. | |
| 5,969,422 A * | 10/1999 | Ting et al. | 257/762 |
| 6,663,787 B1 | 12/2003 | You et al. | |
| 2003/0092274 A1 | 5/2003 | Brintzinger | |
| 2004/0067604 A1 * | 4/2004 | Ouellet et al. | 438/108 |
| 2005/0186786 A1 * | 8/2005 | Brintzinger et al. | 438/650 |

FOREIGN PATENT DOCUMENTS

DE 101 56 054 C2 11/2003

OTHER PUBLICATIONS

Wong, K.K.H., et al., "Metallization by plating for high-performance multichip modules," IBM J. Res. Develop., vol. 42, No. 5, Sep. 1998, pp. 587-596.

* cited by examiner

*Primary Examiner*—Wael M. Fahmy
*Assistant Examiner*—Sonya McCall-Shepard
(74) *Attorney, Agent, or Firm*—Slater & Matsil, L.L.P.

(57) ABSTRACT

A process produces metallic interconnects and contact surfaces on electronic components using a copper-nickel-gold layer structure. The copper core of the interconnects and contact surfaces is deposited by electroplating by means of a first resist mask made from positive resist. The copper core of the interconnects and contact surfaces is surrounded by a nickel-gold layer by means of a second resist mask. The interconnects and contact surfaces are produced by means of two resist masks arranged one on top of the other, in such a way that the copper which forms the core of the interconnect is completely surrounded by the nickel-gold layer, which extends above the copper core, and an adjoining layer that extends beneath the copper core and comprises a diffusion barrier and seed layer.

20 Claims, 2 Drawing Sheets

PROCESS FOR PRODUCING METALLIC INTERCONNECTS AND CONTACT SURFACES ON ELECTRONIC COMPONENTS

This application claims priority to German Patent Application 10 2004 005 361.8, which was filed Feb. 3, 2004, and is incorporated herein by reference.

TECHNICAL FIELD

The invention relates to processes for producing metallic interconnects and contact surfaces on electronic components.

BACKGROUND

It is known to use interconnects arranged in one plane to rewire the contact surfaces (contact pads) of the component into connection contacts, which are preferably arranged in grid form on the surface of the component. These are also designed as contact surfaces in various applications and with the aid of which the component is integrated into an electronic circuit. These arrangements are becoming increasingly important for wafer-level packages or chip-size packages that are produced while still part of the wafer and are all simultaneously provided with rewiring, protective passivation (BCB) and connection contacts before being divided up for the standard subsequent mounting processes. To satisfy the constant demand for ever smaller component dimensions, these components are not encapsulated in a housing, but rather at most have protective passivation or plastic layers, so that their dimensions completely or virtually correspond to those of the integrated circuit (chip) obtained.

There is substantially no separate protection for the interconnects. However, since reliability tests, for example the highly accelerated stress test (HAST), show the interconnects to have signs of corrosion, a second mask, which is to be produced after removal of the first mask and is used to surround the copper interconnect, which serves as the actual electrical conductor, with a nickel-gold layer, has been designed. The nickel-gold layer comprises an individual layer of nickel and an individual layer of gold and is preferably applied by sputtering.

However, it has been determined that the copper core of the interconnects, at its flanks, on account of the shape of the flanks of the openings in the first mask, forms an overhang region in which a residue of the positive resist remains after the latter has been developed, and that this residue of resist can in turn cause corrosion or contamination of the component.

A further possible option for protecting the interconnects consists in applying a passivating layer made from dielectric material over the entire component. However, this thin covering over the entire surface is not suitable for components which have a three-dimensional structure in terms of objects projecting above the component surface. Examples of objects of this type include resilient elevations (elastomer bumps), which carry the connection contacts of the component and are used for reliable contact-connection when connecting materials with significantly different expansion coefficients.

Since the material which forms the covering often flows off these elevations, but the interconnects may also cover these elevations, and furthermore the connection contacts are constructed, similarly to the interconnects, on the top of the elevations and therefore have the same problems, this form of protection cannot be used.

SUMMARY OF THE INVENTION

Therefore, the invention is based on the object of providing a process which allows metallic interconnects and contact surfaces to be produced at low cost on various electronic components using the known and tried-and-tested processes, which do not have the drawbacks presented above.

According to a first embodiment of the invention, a process is presented for producing a copper interconnect on an electronic component wherein a first resist mask is formed over a component with a diffusion barrier and then a second copper seed layer applied thereon. A second resist mask is formed over the second seed layer so that the second seed layer remains uncovered in a contact region. A copper core of an interconnect is deposited on the uncovered second seed layer by electroplating. The second resist mask is then stripped and the diffusion barrier and the second seed layer are etched. A nickel-gold layer is then applied over the copper core and the first resist mask is stripped.

This process ensures that the interconnects and the contact surfaces are produced in such a way that they are completely surrounded by a protective layer and the inclusion of contaminating materials, for example of residues of resist even when the resist is removed by photographic means, is completely avoided.

This advantage is achieved by the fact that the overhang, which is formed at the flanks of the copper core of the interconnects and contact surfaces deposited by electroplating on account of the inclined flanks of the first resist mask, is on the one hand reduced by virtue of a second, strippable resist mask being applied to the first resist mask, superimposed thereon, in such a way that the copper flanks become steeper at least in the upper section and moreover are completely removed on account of the possibility of stripping.

The stripping of the second resist mask is made possible by the introduction of a double layer between the first and second resist masks. This interlayer comprises a first individual layer, which serves as a diffusion barrier, and a second individual layer, which serves as seed layer for the deposition of the copper core by electroplating. Therefore, the interlayer is applied after the first resist has been applied by electroplating and patterned, and this interlayer, after the etching of the region which is not covered by the copper core, ultimately forms the lower part of the subsequent layer which completely surrounds the copper core of the interconnect and the contact surface.

A nickel-gold layer which is applied to the copper core and likewise comprises two individual layers, namely the individual nickel layer and the individual gold layer, adjoining the free terminations of the diffusion barrier and seed layer, forms the second, upper part of the enclosing layer, so that the copper core is now completely enclosed. This layer-like structure of an interconnect using copper as electrical conductor is known to be preferred and should also be retained in the proposed invention, since copper has the best electrical conductivity and gold is eminently suitable as a contact surface, whereas nickel serves primarily as a bonding agent between the two materials.

In addition to the fact that it prevents corrosion through encapsulation of the copper core, for example at copper-nickel-gold junctions which are uncovered and therefore act as electrolytic elements in the humid medium during a reliability test, this layer completely surrounding the copper core also has the advantage that the first resist mask can be stripped as well and therefore its hygroscopic property cannot lead to damage and failures.

Since the second resist mask is to be applied to the first, with corresponding mask openings, a particularly advantageous embodiment of the invention provides for the pattern of the second resist mask to correspond to the pattern of the first resist mask. On account of the flanks of the mask openings being superimposed on one another, this leads in particular to the flanks becoming steeper and consequently to the overhangs of the copper core becoming smaller, which is beneficial to complete removal of the second, upper resist mask.

The corresponding structures of the first and second resist masks therefore make it possible for both resists to be patterned by lithographic means using one mask.

A very effective diffusion barrier between the copper of the interconnect and the electronic component is provided, according to one specific embodiment of the invention, by the diffusion barrier consisting of tantalum nitride. At the same time, the tantalum nitride can also serve as an etching barrier for the copper seed layer in a subsequent standard etching step.

To produce the diffusion barrier and the copper seed layer, it is provided, in a further advantageous configuration of the invention, that the two layers are applied by sputtering. This means that a tried-and-tested process step is used, allowing the production of precise, thin layers which can be differentiated, which is particularly advantageous in order to produce the complete surrounding, according to the invention, of the copper core of the interconnects and contact surfaces.

For the process to be used in wafer-level package technology, the electronic component, as described, is a semiconductor component, which in this specific application is still part of the wafer and is provided with the interconnects and contact surfaces used for rewiring during this production phase. However, it is also possible for the electronic component to be a semiconductor component which has already been divided from the wafer or a polymer component, depending on where and under what conditions interconnects and contact surfaces of this type are required.

BRIEF DESCRIPTION OF THE DRAWINGS

The invention is to be explained in more detail below on the basis of an exemplary embodiment. In the associated drawing.

The following list of reference symbols can be used in conjunction with the figures

| 1 | Electronic component |
| 2 | Interconnect |
| 3 | Copper core |
| 4 | First seed layer |
| 5 | Nickel-gold layer |
| 6 | Flanks |
| 7 | Overhang |
| 8 | Resist residue |
| 9 | First resist mask |
| 10 | Diffusion barrier |

| 11 | Second seed layer |
| 12 | Second resist mask |
| 13 | Nickel layer |
| 14 | Gold layer |

DETAILED DESCRIPTION OF ILLUSTRATIVE EMBODIMENTS

Figure 1:
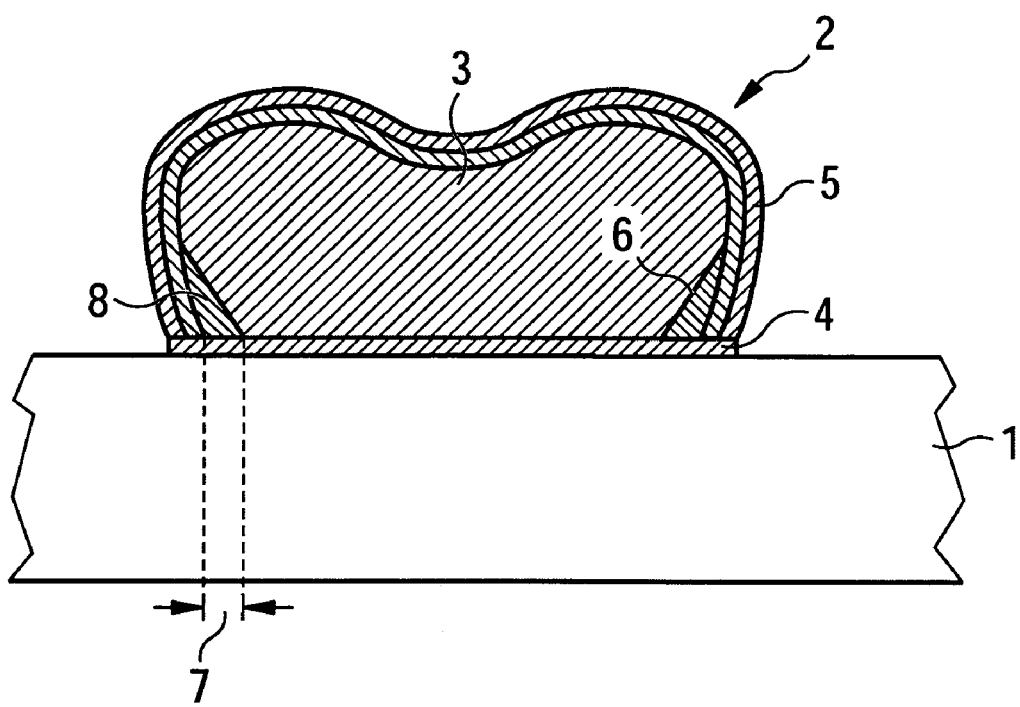
FIG. 1 shows a diagrammatic sectional illustration through an interconnect in accordance with the prior art, and FIG. 2, which includes

FIG. 1 illustrates an electronic component 1, in the exemplary embodiment a semiconductor component, to which an interconnect 2 has been applied. The interconnect 2 comprises a copper core 3 which is arranged on a first seed layer 4 made from copper and is otherwise surrounded by a nickel-gold layer 5.

At its lateral flanks 6, the copper core has an overhang 7 which is filled by a resist residue 8. This resist residue 8 is a residue of the positive first resist mask which has been removed in a known way by photographic developing and causes problems in reliability tests which take place under humid environmental conditions, on account of its hygroscopic properties.

By contrast, FIGS. 2A-2E diagrammatically depict the main process steps according to a preferred embodiment of the invention involved in producing a completely surrounded interconnect 2.

Figure 2A:
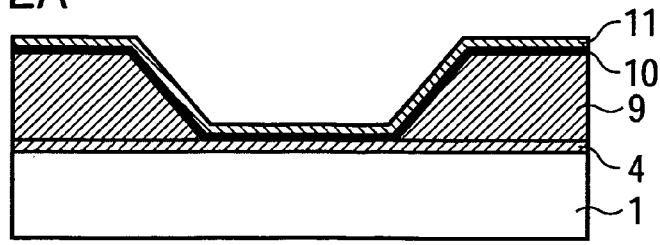
FIGS. 2A-2E, shows a diagrammatic illustration of the process steps according to the invention.

FIG. 2A illustrates an electronic semiconductor component 1, which is copper-laminated by means of first seed layer 4 and is provided with a first resist mask 9. In this exemplary embodiment, the first resist mask 9 comprises an electrophoretic resist and is deposited by electroplating. The resist is patterned by lithographic means and has openings wherever interconnects 2 and contact surfaces are to be produced. The diffusion barrier 10 formed from tantalum nitride and then the second seed layer 11 formed from copper are applied by sputtering so as to cover the surface of the first resist mask 9 and its opening. The thickness of the diffusion barrier 10 is sufficient to ensure a low contact resistance and a high level of protection against corrosion.

Figure 2B:
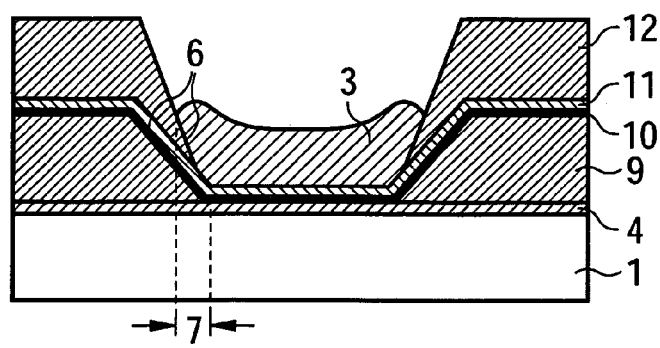

The electronic semiconductor component 1 in FIG. 2B already has the second resist mask 12, which has likewise been deposited on the second seed layer 11 by electroplating and patterned by lithographic means. The opening illustrated in the second resist mask 12 is of the same size and at the same position as the opening in the first resist mask 9. Only the superimposed flanks 6 of the openings in the first resist mask 9 and second resist mask 12 have different inclinations (e.g., are tapered at different angles). The copper core 3 of the interconnect 2, which has a well-shaped cross section on account of the flanks 6, has been applied into the opening in the first resist mask 9 and second resist mask 12 by deposition by electroplating.

Figure 2C:
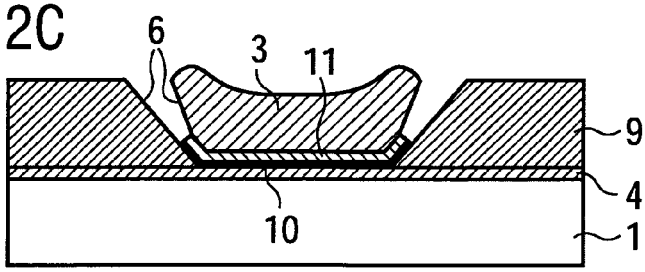

FIG. 2C shows the state of the electronic semiconductor component 1 following the subsequent, complete removal of the second resist mask 12 by means of stripping and the etching of the diffusion barrier 10 and of the second seed layer 11. The well-like shape of the copper core 3 with a slight overhang and the presence of the first resist mask 9 lead to both the diffusion barrier 10 and the second seed layer 11 remaining in place not only beneath the copper core 3 but also in the lower region of its lateral boundary, with a dish-like cross section.

Then, the copper core 3 is plated with nickel and gold in succession. Since the plating takes place in the region of the opening in the first resist mask 9, and on account of the described dish-like shape of the layer formed from diffusion barrier 10 and seed layer 11, the nickel-gold layer 5, which comprises an individual nickel layer 13 and an individual gold layer 14, adjoins the layer formed from diffusion barrier 10 and seed layer 11 without leaving any gaps, so that the copper core 3 is completely enclosed by these two layer systems, as can be seen in FIG. 2D.

Figure 2D:
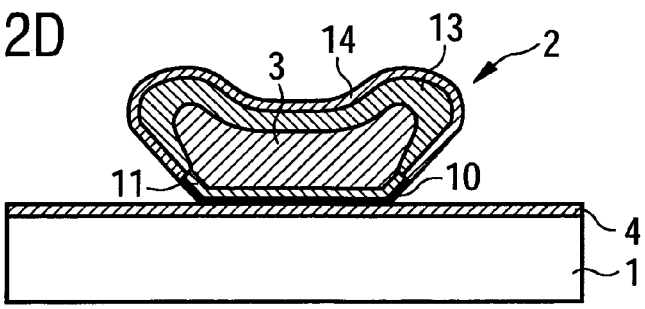
Figure 2E:
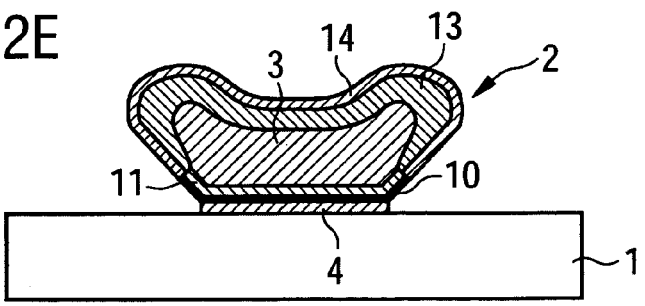

After the copper core 3 has been surrounded, the first resist mask 9 is stripped, with the result that it is completely removed (FIG. 2D, and then the first seed layer 4 made from copper, covering the semiconductor component, is etched as shown in FIG. 2E.

What is claimed is:

1. A process for producing a copper interconnect on an electronic component, the process comprising:
    forming a first resist mask over a component;
    applying a diffusion barrier and then a second copper seed layer over the first resist mask;
    forming a second resist mask over the second seed layer so that the second seed layer remains uncovered in a contact region;
    depositing a copper core of an interconnect on the uncovered second seed layer by electroplating;
    stripping the second resist mask;
    etching the diffusion barrier and the second seed layer;
    applying a nickel-gold layer over the copper core; and
    stripping the first resist mask.

2. The process of claim 1 wherein the second resist mask is formed in a pattern that corresponds to a pattern of the first resist mask.

3. The process of claim 2 wherein forming the first resist mask comprises using a lithographic mask with a pattern and wherein forming the second resist mask comprises using a lithographic mask with the same pattern.

4. The process of claim 1 wherein the diffusion barrier comprises tantalum nitride.

5. The process of claim 1 wherein the diffusion barrier and the second copper seed layer are applied by sputtering.

6. The process of claim 1 wherein the electronic component comprises a semiconductor component.

7. The process of claim 1 wherein the electronic component comprises a polymer component.

8. The process of claim 1 wherein the first resist mask is formed over a first copper seed layer.

9. A method of making an electronic component, the method comprising:
    providing an electronic component having a contact area overlying a surface thereof;
    forming a first resist mask over the electronic component, the first resist mask patterned to form an opening over the contact area;
    forming a conductive layer over the first resist mask, the conductive layer electrically contacting the contact area;
    forming a second resist mask over the electronic component, the second resist mask patterned to form an opening over the contact area;
    depositing a conductor over the contact area, the conductor electrically contacting the contact area;
    removing the second resist mask;
    etching portions of the conductive layer outside of the contact area; and
    removing the first resist mask.

10. The method of claim 9 wherein:
    forming a conductive layer comprises forming a diffusion barrier followed by forming a seed layer of copper; and
    forming a conductor comprises electrodepositing copper.

11. The method of claim 10 wherein the diffusion barrier comprises tantalum nitride.

12. The method of claim 10 and further comprising forming a nickel-gold layer over the copper conductor.

13. The method of claim 10 and further comprising forming a lower seed layer of copper over the surface of the electronic component wherein the first resist mask is formed over the lower seed layer.

14. The method of claim 13 and further comprising removing portions of the lower seed layer that are not beneath the conductor, the removing being performed after removing the first resist mask.

15. The method of claim 10 wherein the diffusion barrier and the seed layer of copper are formed by sputtering.

16. The method of claim 9 wherein the opening in the first resist mask includes a sidewall at a first angle relative to the surface of the electronic component and wherein the opening in the second resist mask includes a sidewall at a second angle relative to the surface of the electronic component, the first angle being different than the second angle.

17. The method of claim 16 wherein the second angle is closer to normal relative to the surface than the first angle.

18. The method of claim 16 wherein the first resist mask is formed using a lithographic mask with a pattern and the second resist mask is formed using a lithographic mask with the same pattern.

19. The method of claim 9 wherein the electronic component comprises a semiconductor component.

20. The method of claim 9 wherein the electronic component comprises a polymer component.

* * * * *

UNITED STATES PATENT AND TRADEMARK OFFICE
CERTIFICATE OF CORRECTION

PATENT NO.       : 7,271,095 B2                                    Page 1 of 1
APPLICATION NO.  : 11/049615
DATED            : September 18, 2007
INVENTOR(S)      : Brintzinger et al.

It is certified that error appears in the above-identified patent and that said Letters Patent is hereby corrected as shown below:

In Col. 4, line 18, delete "core" and insert --core 3--.

Signed and Sealed this

Twenty-seventh Day of November, 2007

JON W. DUDAS
*Director of the United States Patent and Trademark Office*